(12) United States Patent
Chang et al.

(10) Patent No.: US 8,884,325 B2
(45) Date of Patent: Nov. 11, 2014

(54) LED MODULE

(71) Applicant: Advanced Optoelectronic Technology, Inc., Hsinchu Hsien (TW)

(72) Inventors: Chao-Hsiung Chang, Hsinchu (TW); Hopu-Te Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/896,345

(22) Filed: May 17, 2013

(65) Prior Publication Data

US 2013/0341660 A1    Dec. 26, 2013

(30) Foreign Application Priority Data

Jun. 20, 2012  (CN) .......................... 2012 1 2048519

(51) Int. Cl.
*H01L 33/58*  (2010.01)
*H01L 33/48*  (2010.01)

(52) U.S. Cl.
CPC .............. *H01L 33/58* (2013.01); *H01L 33/486* (2013.01); *H01L 2224/48091* (2013.01)
USPC .............. 257/98; 257/E33.073; 257/E33.067

(58) Field of Classification Search
USPC ...................... 257/79–100, E33.055–E33.074
See application file for complete search history.

(56) References Cited

U.S. PATENT DOCUMENTS

| 2010/0230693 | A1 | 9/2010 | Tran |
| 2010/0230708 | A1 | 9/2010 | Tran |
| 2011/0068356 | A1 | 3/2011 | Chiang et al. |
| 2012/0098005 | A1 | 4/2012 | Chan et al. |
| 2013/0270590 | A1* | 10/2013 | Chang et al. .................... 257/98 |

FOREIGN PATENT DOCUMENTS

JP    2002-343292 A    11/2002

* cited by examiner

*Primary Examiner* — Matthew W Such
*Assistant Examiner* — Scott Stowe
(74) *Attorney, Agent, or Firm* — Novak Druce Connolly Bove + Quigg LLP

(57) ABSTRACT

An exemplary LED module includes an LED and a lens covering the LED. The lens includes a light-guiding portion over the LED and retaining portions protruding downwardly from the light-guiding portion. The LED includes a substrate, a first electrode and a second electrode mounted on the substrate, and an LED chip electrically connecting the first electrode and the second electrode respectively. Through holes are defined in the first electrode and the second electrode, respectively. Each retaining portion includes a first rugged portion and a second rugged portion. The retaining portions are inserted into the through holes correspondingly, the first rugged portion connects glue filled in a corresponding through hole, and the second rugged portion abuts the substrate, whereby the lens and the substrate are securely connected together.

15 Claims, 12 Drawing Sheets

LED MODULE

BACKGROUND

1. Technical Field

The present disclosure generally relates to light sources, and particularly to a light emitting diode (LED) module.

2. Description of Related Art

A conventional LED module includes a substrate, at least an LED mounted on the substrate and at least a lens covering the at least an LED whereby light generated by the at least an LED can have a desired pattern of distribution. The lens is fixed to the substrate by glue directly coated on a flat surface of the substrate. However, the glue is difficult to be evenly distributed between the lens and the substrate, which results in unreliable attachment between the lens and the substrate. Therefore, performance of reliability of the LED module is unfavorably affected.

What is needed, therefore, is an LED module which can overcome the above mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe an LED module, in detail.

Figure 1:
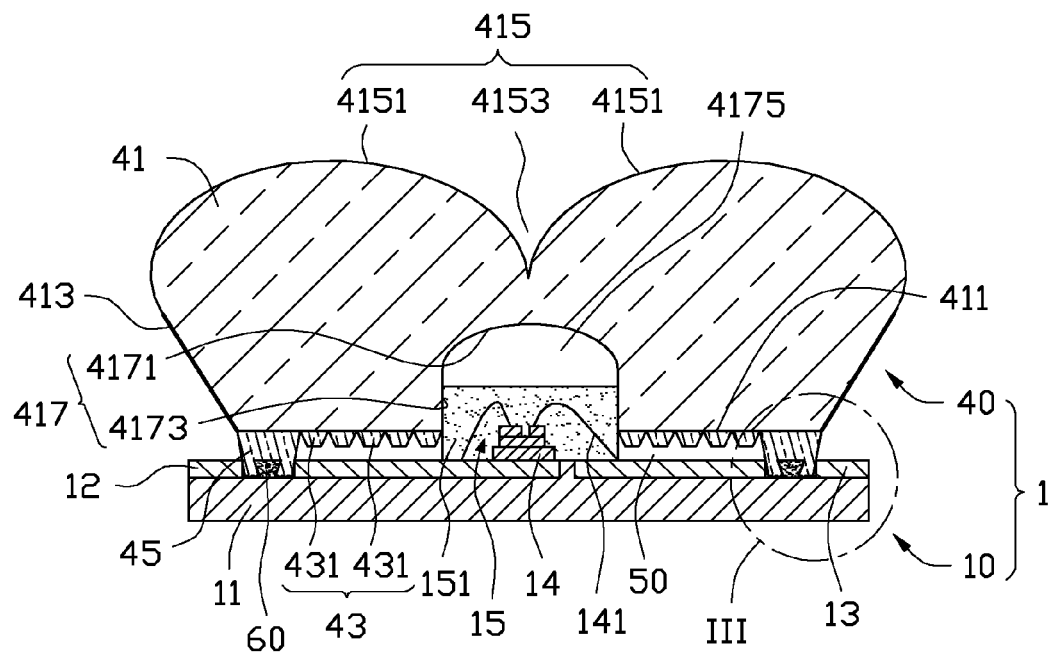
FIG. 1 is a schematic, assembled view of an LED module according to a first embodiment of the present disclosure.

Referring to FIG. 1, an LED module 1 according to a first embodiment of the present disclosure includes an LED 10 and a lens 40 matching with and covering the LED 10.

The LED 10 includes a substrate 11, a first electrode 12, a second electrode 13, an LED chip 14 and an encapsulant 15. The substrate 11 is flat. The first electrode 12 and the second electrode 13 are arranged on a top surface of the substrate 11, and are spaced from each other. The LED chip 14 is mounted on a top surface of the first electrode 12. The LED chip 14 is electrically connected to the first electrode 12 and the second electrode 13 via metal wires 141. The encapsulant 15 encloses the LED chip 14 and the wires 141 therein. The encapsulant 15 is made of epoxy, silicon, glass or other transparent material which has good light-permeable and waterproof capabilities. In this embodiment, a plurality of fluorescent materials 151 may be doped within the encapsulant 15 to adjust the color of the light emitted from the LED chip 14.

Figure 2:
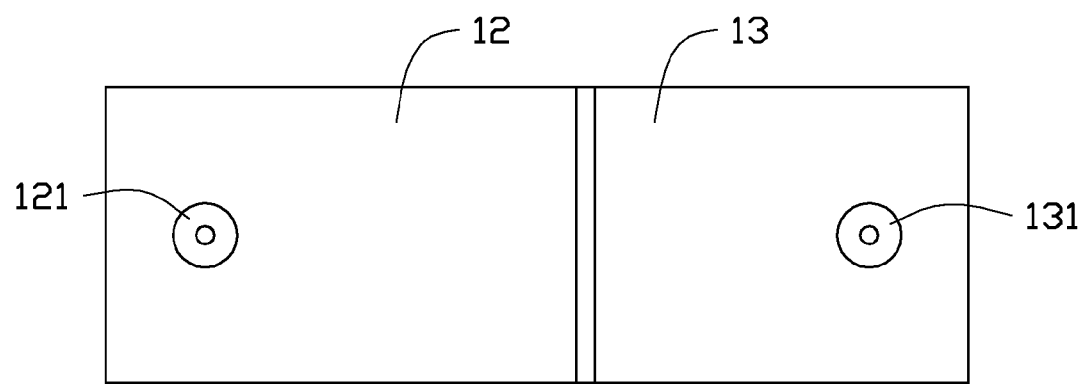
FIG. 2 is a top view of a circuit formed on a substrate of the LED module of FIG. 1.

Referring to FIG. 2, a through hole 121 is defined in the first electrode 12. A through hole 131 is defined in the second electrode 13. The through hole 121 and the through hole 131 are aligned with each other along a longitudinal direction of the substrate 11 and located at a longitudinal middle line of the substrate 11. The through holes 121,131 are used to receive a part of the lens 40 therein. The through hole 121 has a same size to the through hole 131. The through holes 121, 131 are cup-shaped, and an inner diameter of each of the through holes 121, 131 tapers from a top surface of the substrate 11 to a bottom surface of the substrate 11.

The lens 40 covers the encapsulant 15 and the LED chip 14 to change the path of the light emitted from the LED chip 14, thereby improving the utilization rate of the light. The lens 40 is made of a transparent material with a good optical performance, such as PMMA (polymethyl methacrylate) or PC (polycarbonate).

In this embodiment, the lens 40 includes a light-guiding portion 41, a rough portion 43 and a pair of retaining portions 45.

The light-guiding portion 41 includes a curved top surface 415, a flat bottom surface 411 and an annular side surface 413 interconnecting edges of the top surface 415 and the bottom surface 411. The annular side surface 413 tapers along a top-to-bottom direction. A width of the top surface 415 along a direction parallel to the top surface of the substrate 11 is larger than that of the bottom surface 411. The side surface 413 is inclined, and extends downwardly and inwardly from an edge of the top surface 415 to a corresponding edge of the bottom surface 411. The top surface 415 is employed as a light-emergent surface of the LED module 1. Most of the light emitted from the LED 10 leaves the lens 40 from the top surface 415, and another part of the light leaves the lens 40 from the side surface 413.

The top surface 415 includes a pair of first curved surfaces 4151 cooperatively forming a wing-shaped configuration, whereby light emitted from the LED chip 14 can have a bat wing-shaped pattern of distribution after leaving the lens 40. The first curved surfaces 4151 are symmetrical. Each of the first curved surfaces 4151 is convex. Outer edge of each first curved surface 4151 connects a top edge of a corresponding side surface 413. Inner edges of the two first curved surfaces 4151 intersect at a joint 4153. The joint 4153 is located at a center of a top of the lens 40. The joint 4153 is located at a bottom of a recess in a central portion of the top of the lens 40. A distance between each first curved surface 4151 and the bottom surface 411 of the light-guiding portion 41 is gradually decreased from a central portion of the first curved surface 4151 to a periphery of the first curved surface 4151.

A cavity 417 is recessed from a central portion of the bottom surface 411 to receive the LED chip 14 therein. The cavity 417 is surrounded by a second curved surface 4171 and an annular surface 4173 connecting the second curved surface 4171 and the bottom surface 411. The second curved surface 4171 is convex to form a dome and is located over the LED chip 14. The center of the second curved surface 4171 is aligned with the joint 4153. The annular surface 4173 is perpendicular to the substrate 11. The second curved surface 4171 and the annular surface 4173 are employed as a light input surface of the lens 40. A width of the cavity 417 along a direction parallel to the top surface of the substrate 11 equals that of the encapsulant 15.

The rough portion 43 and the two retaining portions 45 are protruding downwardly from the bottom surface 411. The rough portion 43 includes a plurality of continuous protruding portions 431. The protruding portions 431 are evenly arrayed on the bottom surface 411 and located around the cavity 417. Each protruding portion 431 has the same shape and size. Each protruding portion 431 is inverted trapeziform, and tapers from a top end connecting the bottom surface 411 to a bottom end away from the bottom surface 411. An inner surface of each protruding portion 431 may be covered by a reflecting film (not shown) to reflect light in the lens 40 and toward the bottom surface 411 back to the interior of the lens 40. Edges of top ends of adjacent protruding portions 431 connect with each other, and the another parts of the adjacent protruding portions 431 are spaced from each other. The outer edges of the two outmost protruding portions 431 connect inner edges of the two retaining portions 45 respectively.

The rough portion 43 is located above and spaced from the two electrodes 12, 13. A gap 50 is defined between the rough portion 43 and the two electrodes 12, 13 for cool air passing therethrough to cool the LED chip 14. The encapsulant 15 is received in the cavity 417, and the side surface of the encapsulant 15 intimately contacts the annular surface 4173. The top end of the encapsulant 15 is spaced from the second curved surface 4171. An air chamber 4175 is defined between the top end of the encapsulant 15 and the second curved surface 4171. Meanwhile, the LED chip 14 is under the second curved surface 4171. A distance between the LED chip 14 and the second curved surface 4171 is larger than the focal length of the second curved surface 4171. In this state, light emitted from the LED chip 14 can radiate out of the lens 40 to have the bat wing-shaped pattern of distribution.

The two retaining portions 45 are protruding from the bottom surface 411 and located at an outer periphery of the rough portion 43. The retaining portions 45 are spaced from each other. The lens 40 is fixed to the substrate 11 by inserting the two retaining portions 45 into the through hole 121 and the through hole 131. A bottom end of each of the two retaining portions 45 abuts against the substrate 11.

Each retaining portion 45 is a frustum cone, and tapers from a top end connecting the bottom surface 411 to a bottom end away from the bottom surface 411. A height of the retaining portion 45 is larger than that of each protruding portion 431.

A Cartesian coordinate system is imposed to describe different positions of the retaining portion 45. A Z-axis of the Cartesian coordinate system is parallel to a height direction of the retaining portion 45. An X-axis of the Cartesian coordinate system is parallel to the longitudinal direction of the substrate 11. A Y-axis of the Cartesian coordinate system is parallel to a transverse direction of the substrate 11.

Figure 3:
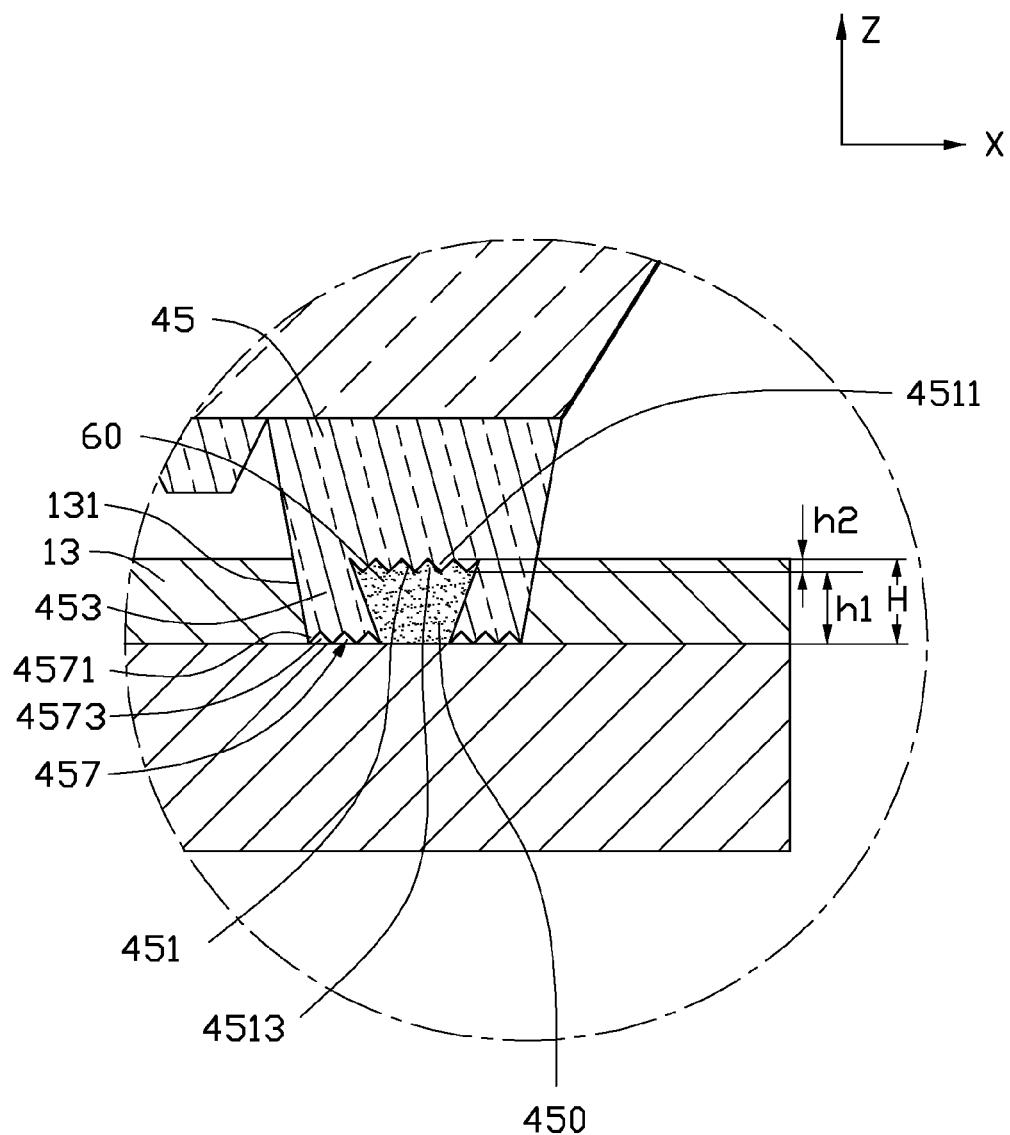
FIG. 3 is an enlarged front side view of a circled portion III of FIG. 1 in the XZ plane.

FIG. 3 shows an enlarged front side view of a cavity 450 in the XZ plane. The cavity 450 is recessed from a central portion of the bottom end of the retaining portion 45 toward a middle of the retaining portion 45 along the Z-axis. The cavity 450 extends through the retaining portion 45 along the Y-axis, which means that the cavity 450 is opened downwardly, forwardly and rearwards. The cavity 450 is used to receive glue 60 therein. The cavity 450 along the Z-axis tapers from a top end adjacent to the bottom surface 411 to a bottom end connecting the substrate 11. A height h1 of the cavity 450 extending along the Z-axis is less than a depth H of the through hole 131 (121).

A first rugged portion 451 is formed on a top surface of the cavity 450. The first rugged portion 451 comprises a plurality of continuing bulges 4511, whereby contacting areas between the top surface of the cavity 450 and glue 60 is increased. Each bulge 4511 is in the form of teeth. Furthermore, the rugged portion 451 having the bulges 4511 increases a friction forces between the top surface of the cavity 450 and the glue 60.

A first receiving slot 4513 is defined between neighboring bulges 4511. The first receiving slot 4513 is recessed along the Z-axis direction upwardly towards the light-guiding portion 41 from the top surface of the cavity 450. A side view of each first receiving slot 4513 in the XZ plane is triangular. The first receiving slot 4513 tapers from a bottom end contacting the glue 60 to a top end away from the glue 60. Preferably, a height h2 of each first receiving slot 4513 extending along the Z-axis plus the height h1 equals the height H, whereby the glues 60 can not be leaked out of the through holes 121, 131.

The retaining portion 45 further includes two fixing parts 453 located at opposite sides of the cavity 450. Each fixing part 453 is located at a lower portion of the retaining portion 45. A front side view of each fixing part 453 in the XZ plane is trapeziform. Each fixing part 453 along the Z-axis direction tapers from the bottom end connecting the substrate 11 to the top end away from the substrate 11. A height of each fixing part 453 along the Z-axis equals the depth H of the through hole 131 (121).

Figure 4:
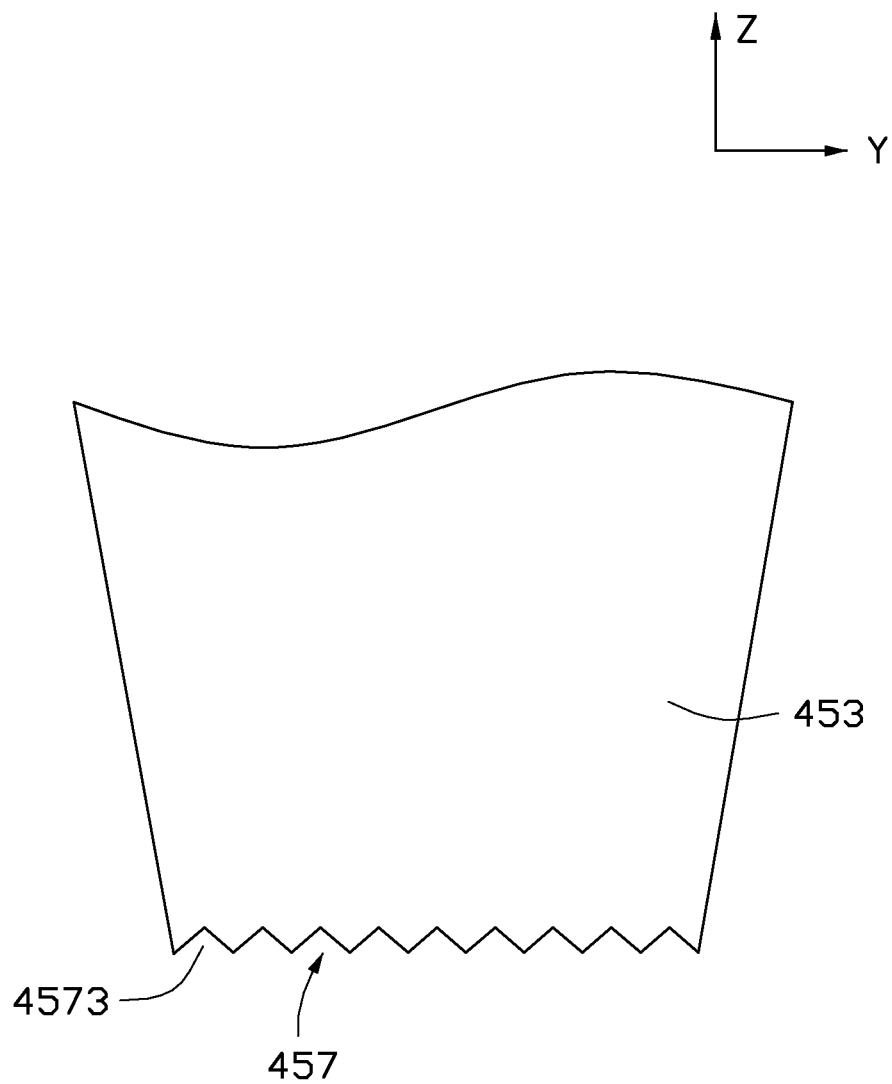
FIG. 4 is an enlarged lateral side view of the circled portion III of FIG. 3 in the YZ plane.

FIG. 4 shows a lateral side view of each fixing part 453 in the YZ plane. The lateral side view of the fixing part 453 is trapeziform, and each fixing part 453 along the Z-axis direction tapers from a top end adjacent to a bottom surface 411 to the bottom end away from the bottom surface 411.

Referring to FIG. 3 and FIG. 4, a second rugged portion 457 is formed at a bottom end of each fixing part 453. The second rugged portion 457 comprises a plurality of continuing bulges 4571, whereby contacting areas between the fixing parts 453 and glue 60 on the substrate 11 is increased. Each bulge 4571 is in the form of teeth. Furthermore, the second rugged portion 457 having the bulges 4571 increases a friction forces between the fixing parts 453 and the substrate 11. A second receiving slot 4573 is defined between neighboring bulges 4571. The second receiving slot 4573 is recessed along the Z-axis direction upwardly towards the light-guiding portion 41 from the bottom surface contacting the substrate 11. A side view of each second receiving slot 4573 in the XZ plane or in the YZ plane is triangular. The second receiving slot 4573 tapers from a bottom end contacting the substrate 11 to a top end away from the substrate 11.

When the lens 40 is assembled with the LED 10, the glue 60 is injected into the through hole 121,131; then, the retaining portions 45 are inserted into the corresponding through hole 121,131, until the first rugged portions 451 contacts the glue 60, and the second rugged portions 457 of the retaining portion 45 abut on the top surface of the substrate 11. Such that, the fixing parts 453 are inserted into the through hole 121,131 and surrounded by the glue 60. The cavity 450 and the first receiving slots 4513, the second receiving slots 4573 are filled with glue 60. At the same time, an outer surface of the retaining portions 45 abut edges of first and second electrodes 12, 13 defining the though holes 121,131 to secure the lens 40 to the substrate 11.

In this embodiment, more glue 60 connects the fixing parts 453 and the substrate 11, and a friction forces between the fixing parts 453 and the substrate 11 is further increased. Furthermore, the glue 60 filled into the cavity 450, the first receiving slots 4513 of the first rugged portions 451, and the second receiving slots 4573 of the second rugged portion 457 makes a connecting force between the retaining portions 45 and the substrate 11 increased. So, the lens 40 can be fixed to the substrate 11 more firmly. Furthermore, since the glue 60 is received in the cavities 450, the first receiving slots 4513, the second receiving slots 4573 and the through holes 121, 131, no contamination of the LED module 1 due to an overflow of the glue 60 is obtainable by the present disclosure.

Figure 5:
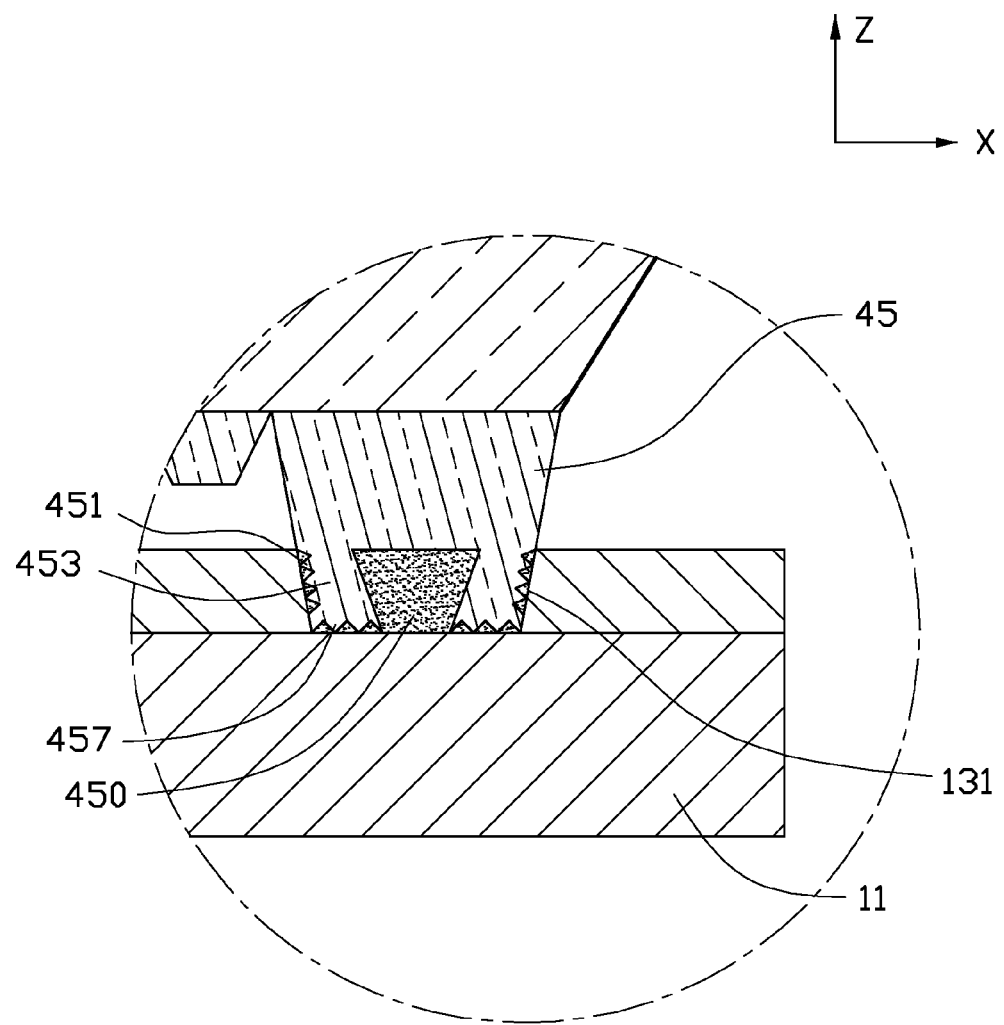
FIG. 5 is an enlarged front side view of a retaining portion according to a second embodiment of the present disclosure in the XZ plane.
Figure 6:
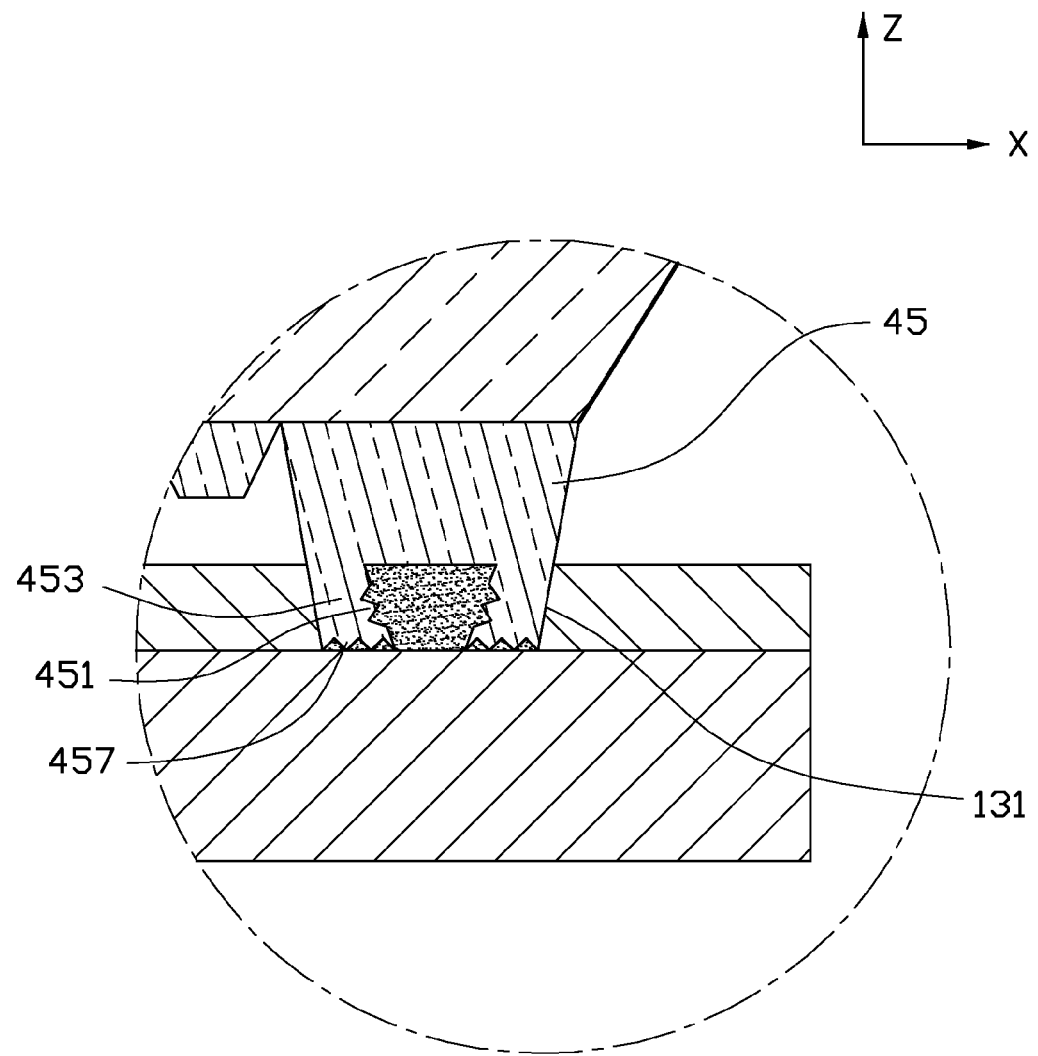
FIG. 6 is an enlarged front side view of a retaining portion according to a third embodiment of the present disclosure in the XZ plane.
Figure 7:
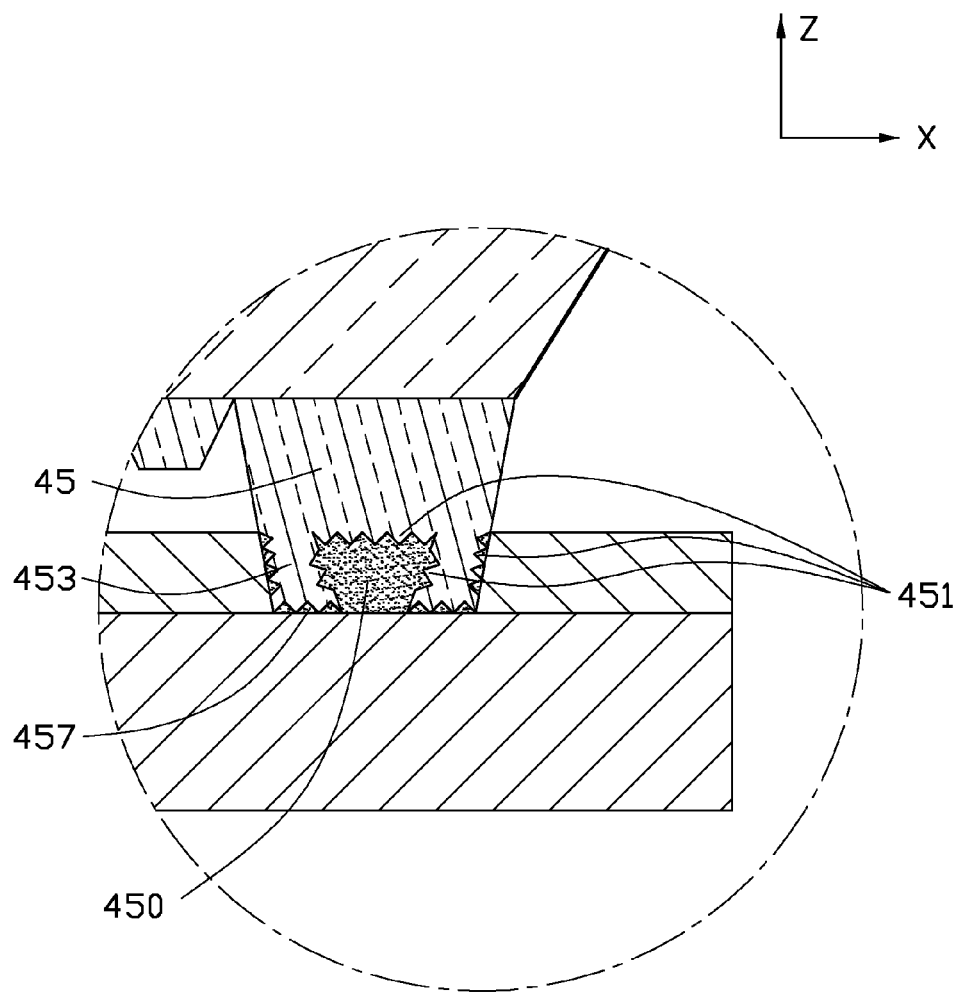
FIG. 7 is an enlarged front side view of a retaining portion according to a forth embodiment of the present disclosure in the XZ plane.

Referring to FIG. 5, a difference between a second embodiment of FIG. 5 and the first embodiment of FIG. 3 of the disclosure is that the first rugged portion 451 of the second embodiment is formed on outer surfaces of each fixing part 453. Alternatively, in a third embodiment, the first rugged portion 451 can be formed on inner surfaces of each fixing part 453 (shown in FIG. 6), or in a forth embodiment, the first rugged portion 451 can be formed on inner surfaces of each fixing part 453, outer surfaces of each fixing part 453 and the top surface of the cavity 450 (shown in FIG. 7).

Figure 8:
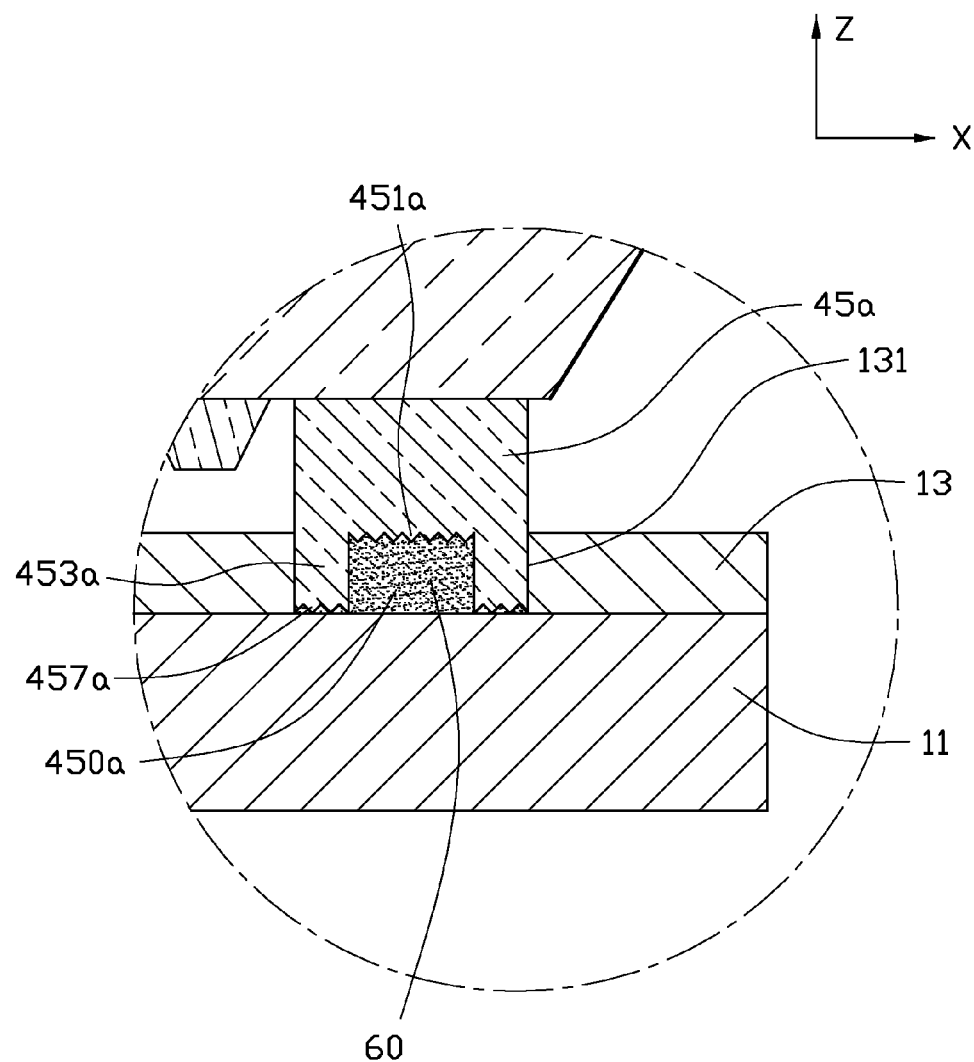
FIG. 8 is an enlarged front side view of a retaining portion according to a fifth embodiment of the present disclosure in the XZ plane.

Referring to FIG. 8, a difference between a fifth embodiment of FIG. 8 and the first embodiment of FIG. 3 of the disclosure is that a lateral front side view of each retaining portion 45a and a cavity 450a of the fifth embodiment is rectangular. As such, a lateral front side view of each fixing part 453a is also rectangular. An outer diameter of the each retaining portion 45a equals an inner diameter of the corresponding through hole 121 (131). A first rugged portion 451a is formed on a top surface of the cavity 450a, and a second rugged portion 457a is formed on a bottom end of each fixing part 453a.

Figure 9:
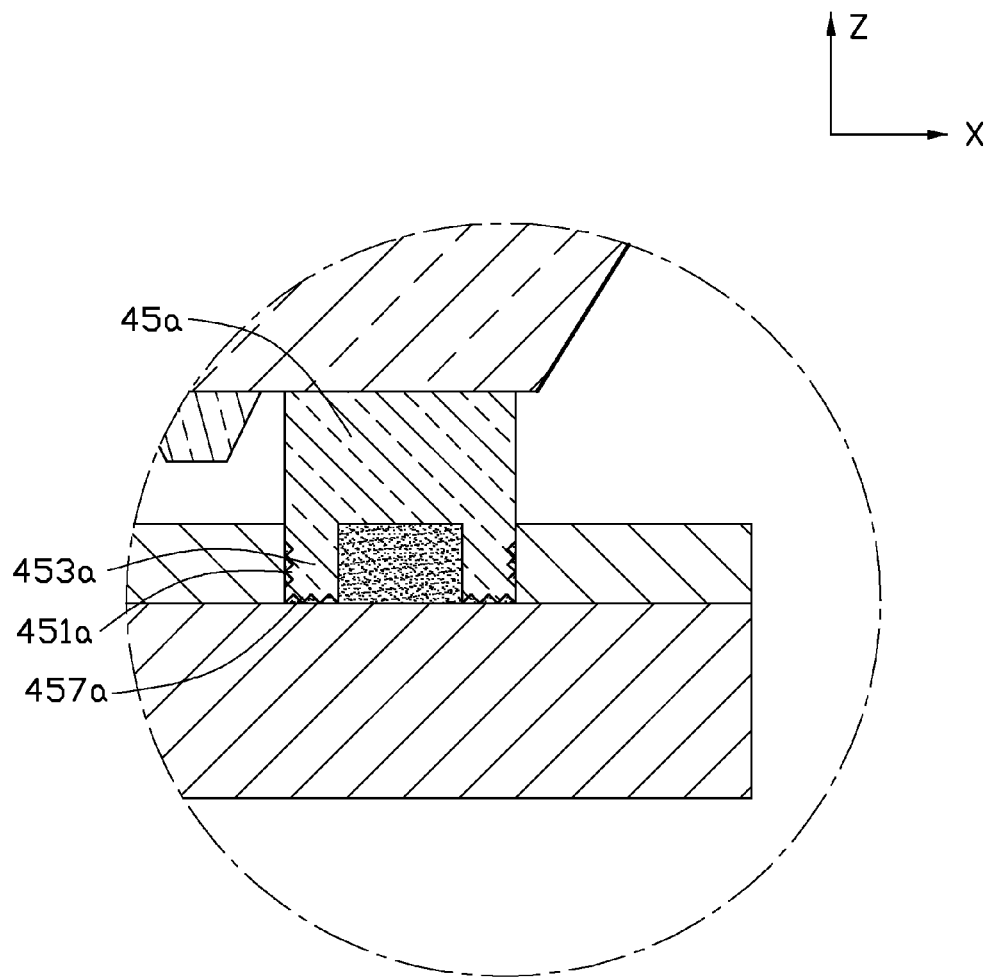
FIG. 9 is an enlarged front side view of a retaining portion according to a sixth embodiment of the present disclosure in the XZ plane.
Figure 10:
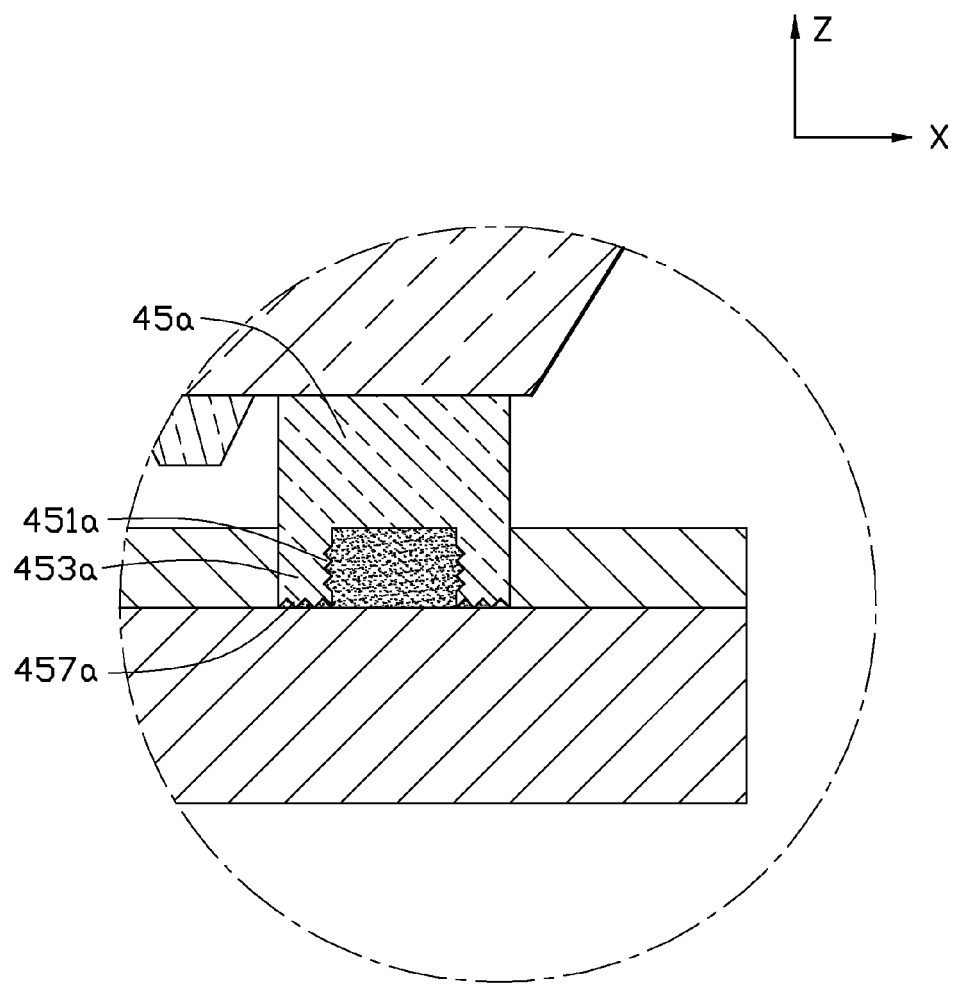
FIG. 10 is an enlarged front side view of a retaining portion according to a seventh embodiment of the present disclosure in the XZ plane.
Figure 11:
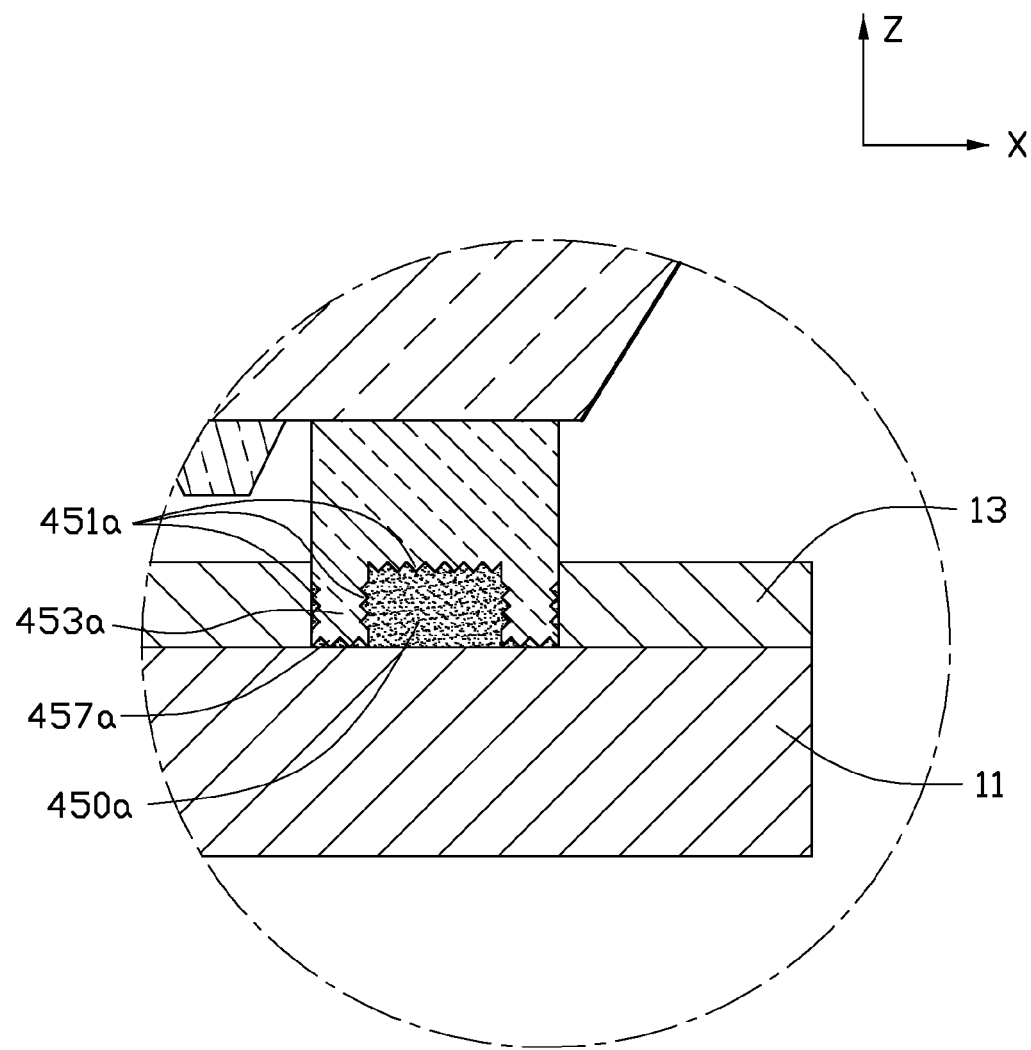
FIG. 11 is an enlarged front side view of a retaining portion according to an eighth embodiment of the present disclosure in the XZ plane.

Alternatively, in a sixth embodiment, the first rugged portion 451a can be formed on outer surfaces of each fixing part 453a (shown in FIG. 9), or in a seventh embodiment, the first rugged portion 451a can be formed on inner surfaces of each fixing part 453a (shown in FIG. 10), or as FIG. 11 shown, in an eighth embodiment, the first rugged portion 451a can be formed on inner surfaces of each fixing part 453a, formed on outer surfaces of each fixing part 453a and formed on the top surface of the cavity 450a, respectively.

Figure 12:
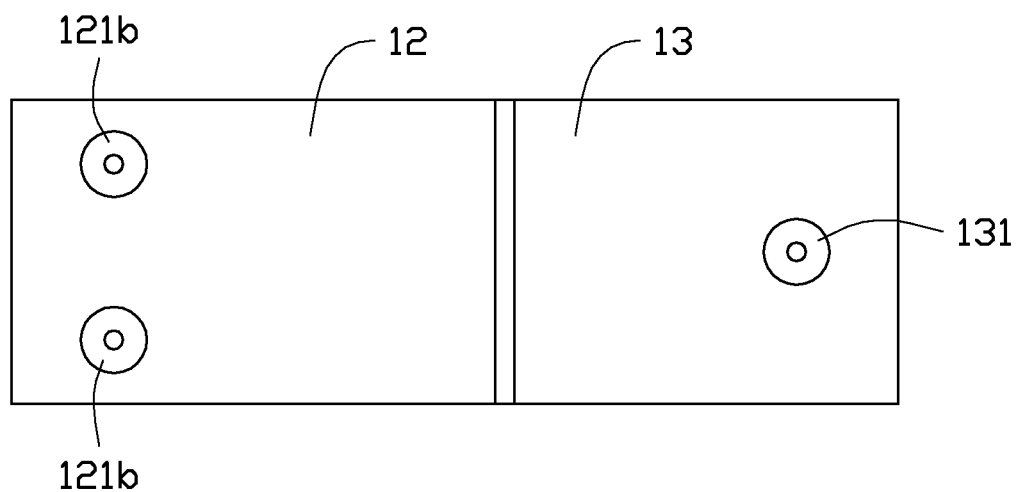
FIG. 12 is a top view of another circuit formed on a substrate of an LED module according to the present disclosure in the XZ plane.

Alternatively, the number of the retaining portion 45 and the number of the through hole 121 (131) are not limited to the above disclosed. Referring to FIG. 12, in this embodiment, the number of the retaining portion 45 is three, and the number of the through hole 121 (131) corresponding to the retaining portion 45 is also three. The three retaining portions 45 are inserted into the corresponding through holes 121b, 131. A line connecting the three holes forms a triangle, whereby the lens 40 would be fixed more firmly.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED module comprising:
an LED and a lens covering the LED, the LED comprising a substrate, a first electrode and a second electrode mounted on the substrate and an LED chip, a plurality of through holes being defined in the first electrode and the second electrode respectively, the lens comprising a light-guiding portion over the LED and a plurality of retaining portions protruding downwardly from the light-guiding portion, each retaining portion including a first rugged portion and a second rugged portion, the retaining portions being inserted into the through holes correspondingly, and the first rugged portion connecting glue filled in a corresponding through hole, the second rugged portion abutting the substrate, wherein a cavity is defined at a bottom end of each retaining portion, two fixing parts are located at opposite sides of the cavity, and the second rugged portion is formed on a bottom end of each fixing part.

2. The LED module as claimed in claim 1, wherein the first rugged portion is formed on a top surface of the cavity.

3. The LED module as claimed in claim 1, wherein the first rugged portion is formed on outer surfaces of each fixing part.

4. The LED module as claimed in claim 1, wherein the first rugged portion is formed on inner surfaces of each fixing part.

5. The LED module as claimed in claim 1, wherein the first rugged portion is formed on inner surfaces and outer surfaces of each fixing part, and on a top surface of the cavity, respectively.

6. The LED module as claimed in claim 1, wherein each of the first rugged portion and the second rugged portion comprises a plurality of continuing bulges.

7. The LED module as claimed in claim 6, wherein each bulge is in a form of teeth.

8. The LED module as claimed in claim 7, a receiving slot is defined between neighboring bulges.

9. The LED module as claimed in claim 8, a height of the receiving slot plus a height of the cavity equals a height of each through hole.

10. An LED module comprising:
an LED and a lens covering the LED, the LED comprising a substrate, a first electrode and a second electrode mounted on the substrate and an LED chip, a plurality of through holes being defined in the first electrode and the second electrode respectively, the lens comprising a light-guiding portion over the LED and a plurality of retaining portions protruding downwardly from the light-guiding portion, a slot extending through a bottom end of each retaining portion, two fixing parts located on opposite sides of each slot, wherein a first rugged portion being formed on an inner surfaces of each slot, the retaining portions being inserted into the through holes correspondingly, and the first rugged portion connecting glue filled in a corresponding through hole.

11. The LED module as claimed in claim 10, wherein a second rugged portion is formed on a bottom end of each fixing part.

12. The LED module as claimed in claim 11, wherein each of the first rugged portion and the second rugged portion comprises a plurality of continuing bulges.

13. The LED module as claimed in claim 12, each bulge is in a form of teeth.

14. The LED module as claimed in claim 13, a receiving slot is defined between neighboring bulges.

15. The LED module as claimed in claim 14, a height of the receiving slot plus a height of the slot equals a height of each through hole.

* * * * *